United States Patent
Lai et al.

(10) Patent No.: US 9,293,348 B2
(45) Date of Patent: Mar. 22, 2016

(54) SEMICONDUCTOR STRUCTURE INCLUDING STACKED STRUCTURE AND METHOD FOR FORMING THE SAME

(71) Applicant: Macronix International Co., Ltd., Hsinchu (TW)

(72) Inventors: Erh-Kun Lai, Taichung (TW); Guan-Ru Lee, Kaohsiung (TW); Yen-Hao Shih, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/143,040

(22) Filed: Dec. 30, 2013

(65) Prior Publication Data
US 2015/0187694 A1    Jul. 2, 2015

(51) Int. Cl.
| H01L 23/528 | (2006.01) |
| --- | --- |
| H01L 27/105 | (2006.01) |
| H01L 23/522 | (2006.01) |
| H01L 21/3213 | (2006.01) |
| H01L 21/3205 | (2006.01) |

(Continued)

(52) U.S. Cl.
CPC .... *H01L 21/32133* (2013.01); *H01L 21/32055* (2013.01); *H01L 21/76805* (2013.01); *H01L 21/76834* (2013.01); *H01L 21/76877* (2013.01); *H01L 21/76883* (2013.01); *H01L 27/11568* (2013.01); *H01L 27/11578* (2013.01); *H01L 29/4234* (2013.01); *H01L 29/66833* (2013.01); *H01L 29/792* (2013.01)

(58) Field of Classification Search
CPC ............ H01L 23/528; H01L 21/32055; H01L 23/5226; H01L 23/53271; H01L 32/76805; H01L 21/76834; H01L 21/76877; H01L 21/76883; H01L 29/66833; H01L 29/792; H01L 27/11568; H01L 27/11578; H01L 29/4234; H01L 21/32133; H01L 21/3205; H01L 21/3213; H01L 21/768; H01L 23/532; H01L 23/522; H01L 27/105
USPC ............ 257/756, 314, 5, 209, 211, 529, 532, 257/315, 506, 324, 4, 3, 2, E29.002, 382, 257/773.774
See application file for complete search history.

(56) References Cited

U.S. PATENT DOCUMENTS

| 5,398,200 A | * | 3/1995 | Mazure et al. | ................. 365/174 |
| 5,554,870 A | * | 9/1996 | Fitch et al. | ..................... 257/334 |

(Continued)

OTHER PUBLICATIONS

Lue, et al.: "A Novel Junction-Free BE-SONOS NAND Flash"; 2008 Symposium on VLSI Technology Digest of Technical Papers; pp. 140-141.

(Continued)

*Primary Examiner* — Alexander Oscar Williams
(74) *Attorney, Agent, or Firm* — McClure, Qualey & Rodack, LLP

(57) ABSTRACT

A semiconductor structure and a method for forming the same are provided. The semiconductor structure includes a substrate, a stacked structure, a dielectric layer, a conductive structure, a dielectric structure and a conductive plug. The stacked structure includes dielectric films and conductive films arranged alternately. The dielectric layer is between the conductive structure and a sidewall of the stacked structure. The dielectric structure is on the stacked structure and defining a through via. The conductive plug fills the through via and physically contacts one of the conductive films exposed by the through via and adjoined with the dielectric layer.

12 Claims, 8 Drawing Sheets

(51) Int. Cl.
  *H01L 21/768* (2006.01)
  *H01L 29/792* (2006.01)
  *H01L 27/115* (2006.01)
  *H01L 29/423* (2006.01)
  *H01L 29/66* (2006.01)

(56) References Cited

U.S. PATENT DOCUMENTS

| | | | |
|---|---|---|---|
| 8,173,987 B2 * | 5/2012 | Lung | 257/2 |
| 8,372,732 B2 | 2/2013 | Kim | |
| 8,486,791 B2 * | 7/2013 | Lue | 438/294 |
| 8,503,213 B2 * | 8/2013 | Chen et al. | 365/63 |
| 8,574,992 B2 * | 11/2013 | Chen et al. | 438/288 |
| 8,759,899 B1 * | 6/2014 | Lue et al. | 257/315 |
| 8,829,646 B2 * | 9/2014 | Lung et al. | 257/530 |
| 2008/0094873 A1 * | 4/2008 | Lai et al. | 365/148 |
| 2011/0059595 A1 * | 3/2011 | Jung | 438/430 |
| 2011/0280077 A1 * | 11/2011 | Fishburn | 365/185.18 |
| 2012/0100700 A1 | 4/2012 | Kim | |
| 2012/0181654 A1 | 7/2012 | Lue | |
| 2012/0205722 A1 | 8/2012 | Lee et al. | |
| 2012/0276696 A1 * | 11/2012 | Yang et al. | 438/156 |
| 2013/0043509 A1 * | 2/2013 | Cho et al. | 257/208 |
| 2013/0075802 A1 | 3/2013 | Chen et al. | |
| 2013/0127011 A1 * | 5/2013 | Higashitani et al. | 257/532 |
| 2013/0164922 A1 * | 6/2013 | Cho et al. | 438/510 |
| 2013/0229846 A1 * | 9/2013 | Chien et al. | 365/51 |
| 2013/0328005 A1 * | 12/2013 | Shin et al. | 257/1 |
| 2014/0103530 A1 * | 4/2014 | Lai et al. | 257/755 |
| 2014/0151627 A1 * | 6/2014 | Hong et al. | 257/4 |
| 2014/0151774 A1 * | 6/2014 | Rhie | 257/314 |
| 2014/0166963 A1 * | 6/2014 | Lee | 257/4 |
| 2014/0246716 A1 * | 9/2014 | Sinha | 257/315 |
| 2015/0084204 A1 * | 3/2015 | Yun et al. | 257/773 |

OTHER PUBLICATIONS

Non-Final Office Action issued by USPTO for U.S. Appl. No. 13/652,701, filed Oct. 16, 2012, mailed Sep. 25, 2014.
Final Office Action issued by USPTO for U.S. Appl. No. 13/652,701, filed Oct. 16, 2012, mailed Feb. 17, 2015.
Non-Final Office Action issued in U.S. Appl. No. 14/474,399, filed Sep. 2, 2014, mailed Nov. 18, 2015.

* cited by examiner

SEMICONDUCTOR STRUCTURE INCLUDING STACKED STRUCTURE AND METHOD FOR FORMING THE SAME

BACKGROUND

1. Technical Field

The invention relates to a semiconductor structure and a method for forming the same and more specifically to a contact pad structure and a method for forming the same.

2. Description of the Related Art

The demand of memory devices increases complying with a growth in market of the electronic products. There are several types of memory devices, such as volatile and non-volatile memory (NVM) devices.

The dynamic random access memory (DRAM) and the cache memory are volatile memories. Although a read access velocity of a volatile memory is fast, a non-volatile memory can be used as a hard disk since data stored in non-volatile memories will exist even when the current pinch off. According to read/write characteristic differences of memory devices, the non-volatile memory can be separated into read only memory (ROM) and flash memory. Recently, flash memory has been widely used in a variety of filed, such as cell phone, digital camera and MP3.

In order to increase a storage capacity of the memory in a limited memory volume, a three dimensional (3D) memory is developed. In a 3D memory, pitches between each of elements are smaller and an element density in an unit area of the 3D memory is larger.

SUMMARY

According to one embodiment, a semiconductor structure is provided. The semiconductor structure comprises a substrate, a stacked structure, a dielectric layer, a conductive structure, a dielectric structure and a conductive plug. The stacked structure comprises dielectric films and conductive films arranged alternately. The dielectric layer is between the conductive structure and a sidewall of the stacked structure. The dielectric structure is on the stacked structure and defining a through via. The conductive plug fills the through via and physically contacts one of the conductive films exposed by the through via and adjoined with the dielectric layer.

According to another embodiment, a method for forming a semiconductor structure is provided. The method comprises following steps. A stacked structure comprising dielectric films and conductive films arranged alternately is formed on a substrate. A dielectric layer is formed on a sidewall of the stacked structure. A conductive structure is formed on the dielectric layer. A dielectric structure is formed on the stacked structure. A conductive plug is formed to pass through the dielectric structure and physically contact one portion of one of the conductive films having an electric conductivity higher than an electric conductivity of the other portion of the one of the conductive films.

DETAILED DESCRIPTION

FIGS. 1A~6C illustrate a method for forming a semiconductor structure. The figures marked with "A" are top views, and the figures marked with "B" are cross-section views taken along BB line in the top views.

Figure 1A:
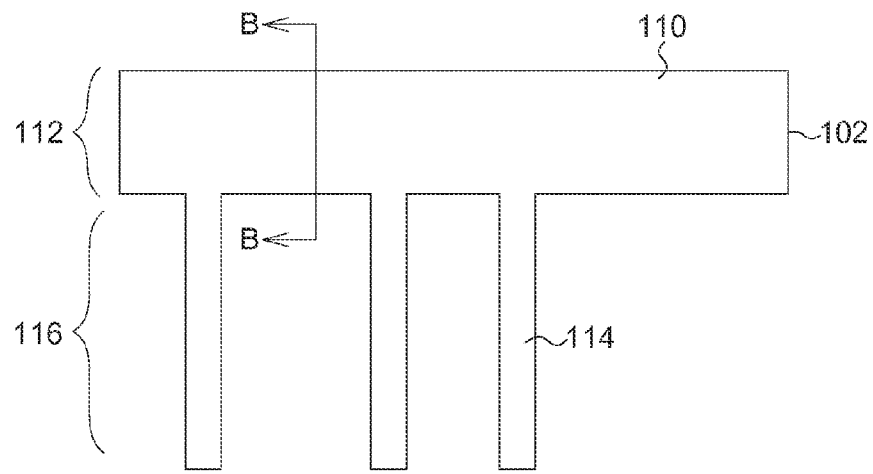
FIGS. 1A~6C illustrate a method for forming a semiconductor structure.
Figure 1B:
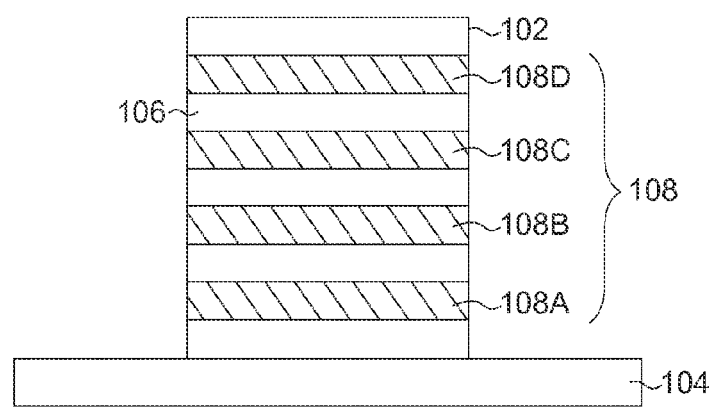

Referring to FIGS. 1A and 1B, a stacked structure 102 is formed on a substrate 104. The stacked structure 102 comprises dielectric films 106 and a conductive film 108 comprising conductive films 108A, 108B, 108C, 108D arranged alternately. Amount of the dielectric film and the conductive film may be varied according to actual demands properly.

In embodiments, the conductive films 108A, 108B, 108C, 108D comprise an un-doped Si or an un-doped polysilicon. The dielectric film 106 may comprise an oxide, a nitride, an oxynitride, such as silicon oxide, silicon nitride, silicon oxynitride, or other suitable materials. The conductive films 108A, 108B, 108C, 108D are conductively insulated from each other by the dielectric films 106. As shown in FIG. 1A, the stacked structure 102 comprise a pad portion 110 in a pad region 112 and strip portions 114 in an array region 116. An amount of the strip portions 114 extended from a side all of the pad portion 110 may be varied according to actual demands.

Figure 2A:
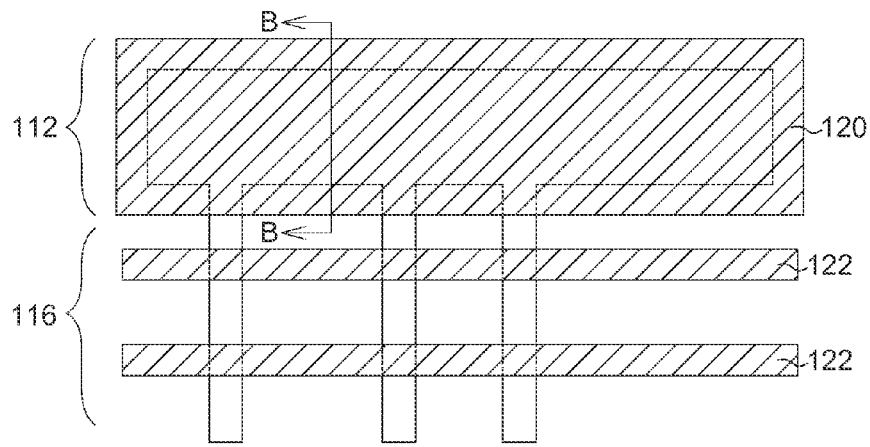
Figure 2B:
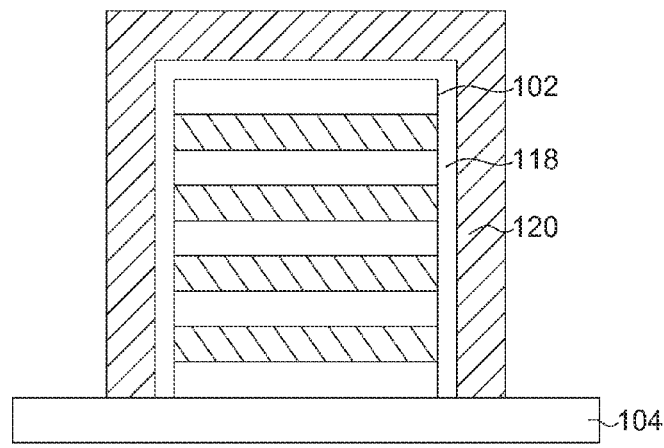

Referring to FIGS. 2A and 2B, a dielectric layer 118 is formed on an upper surface and a sidewall of the stacked structure 102. The dielectric layer 118 may comprise a conformal material formed by a deposition method such as a CVD method or a PVD method, or other suitable methods. The dielectric layer 118 may comprise an oxide, a nitride, an oxynitride, such as silicon oxide, silicon nitride, silicon oxynitride, or other suitable materials. In one embodiment, the dielectric layer 118 has a multi-layer structure such as an ONO structure or an ONONO structure, but is not limited thereto, and may have a single-layer structure, or other suitable structures. In one embodiment, the dielectric layer 118 is a multi-layer structure of tunneling layer/trapping layer/blocking layer.

A conductive structure 120 is formed on the dielectric layer 118 in the pad region 112. A word line (WL) 122 is formed on the dielectric layer 118, not shown in FIG. 2A, in the array region 116. In one embodiment, the conductive structure 120 and the word line 122 are formed at the same time. For example, the conductive structure 120 and the word line 122 may be formed by a process comprising forming a conductive material and patterning the conductive material by the same photolithography process. The photolithography process for forming the conductive structure 120 and the word line 122 at the same time can reduce etch loading effect, compared to a photolithography for forming only the word line 122. Therefore, an accuracy of feature of a product and a yield can be increased.

Figure 3A:
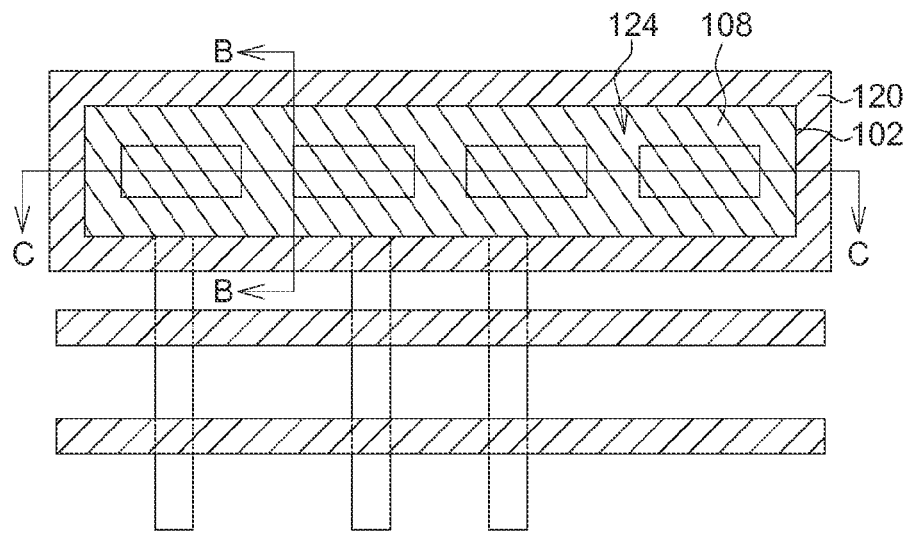
Figure 3B:
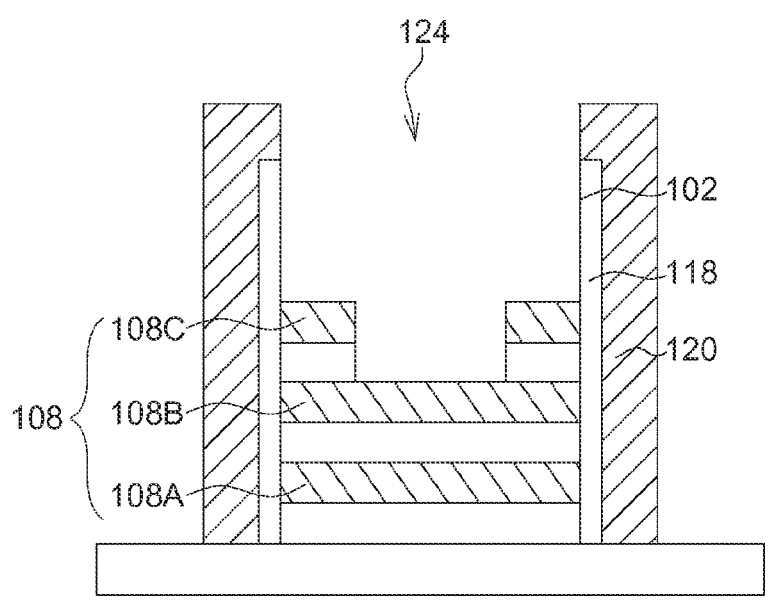
Figure 3C:
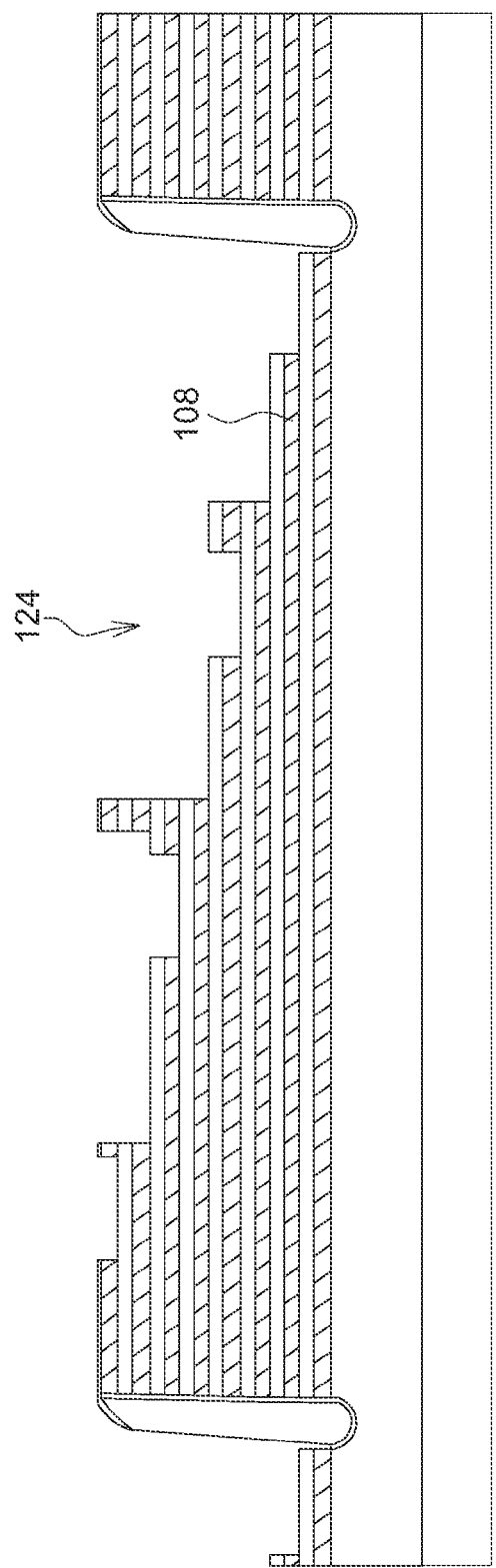

Referring to FIGS. 3A and 3B, for example, upper portions of conductive structure 120, the dielectric layer 118 (not shown in FIG. 3A) and the stacked structure 102 are removed to form an opening 124 exposing the conductive film 108. In embodiments, the opening 124 in different regions exposes the conductive films 108A, 108B, 108C, 108D of different levels. According to one embodiment, for example, the semiconductor structure may have a stair plane structure as shown in a cross-section view of FIG. 3C taken from a line corresponding a CC line in FIG. 3A. As shown in FIG. 3C, the opening 124 exposes the conductive film 108 of different levels.

Figure 4A:
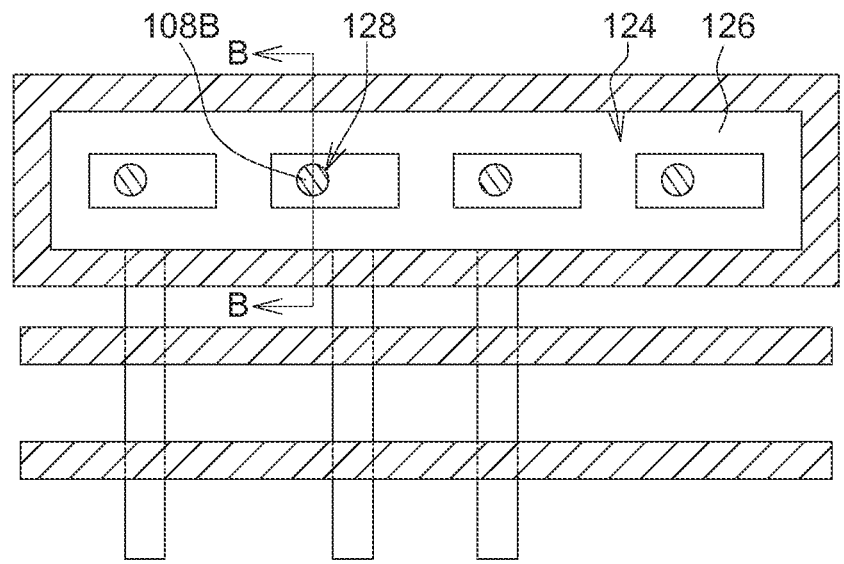
Figure 4B:
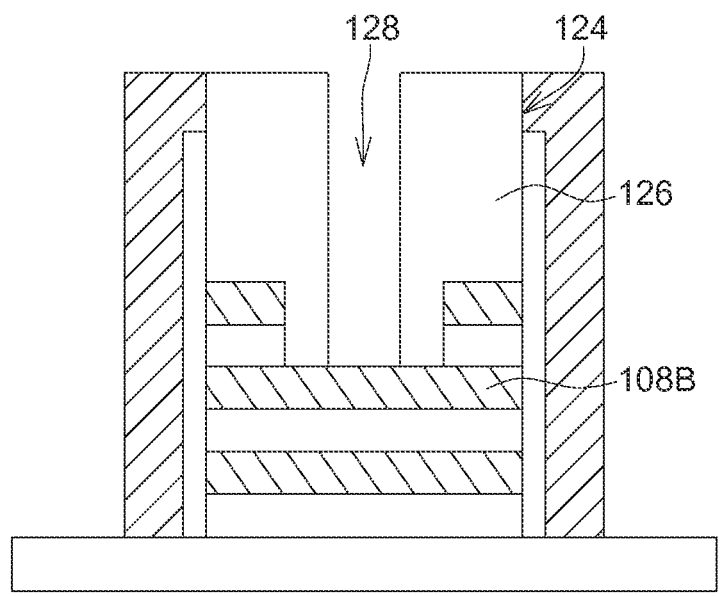

Referring to FIGS. 4A and 4B, the opening 124 is filled with a dielectric structure 126. The dielectric structure 126 may comprise an oxide, a nitride, an oxynitride, such as silicon oxide, silicon nitride, silicon oxynitride, or other suitable materials. The dielectric structure 126 may be formed by a deposition method such as CVD method or PVD method, or other suitable methods. A portion of the dielectric structure 126 is removed to define a through via 128 exposing the conductive film 108B, for example. Based on the similar concepts, through via 128 in other regions exposes other conductive film such as conductive films 108A, 108C, 108D, not described in detail herein for the sake of brevity.

Figure 5A:
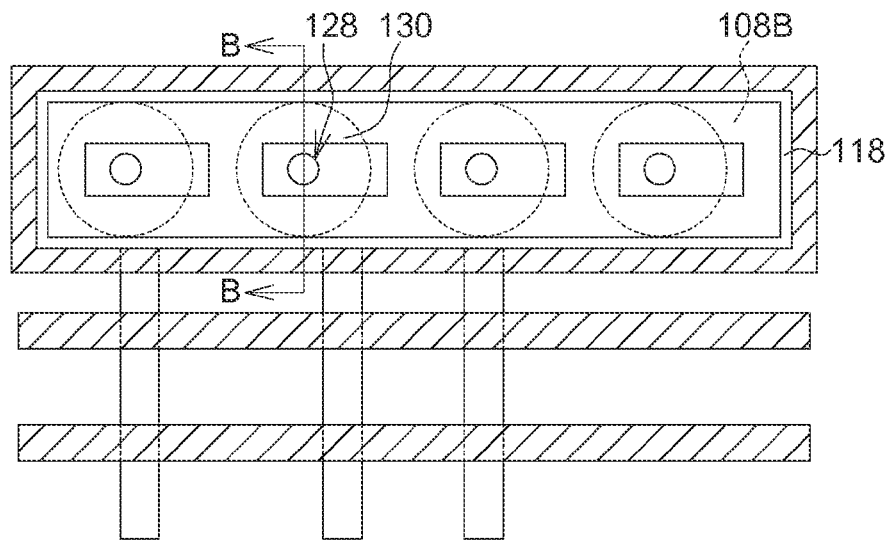
Figure 5B:
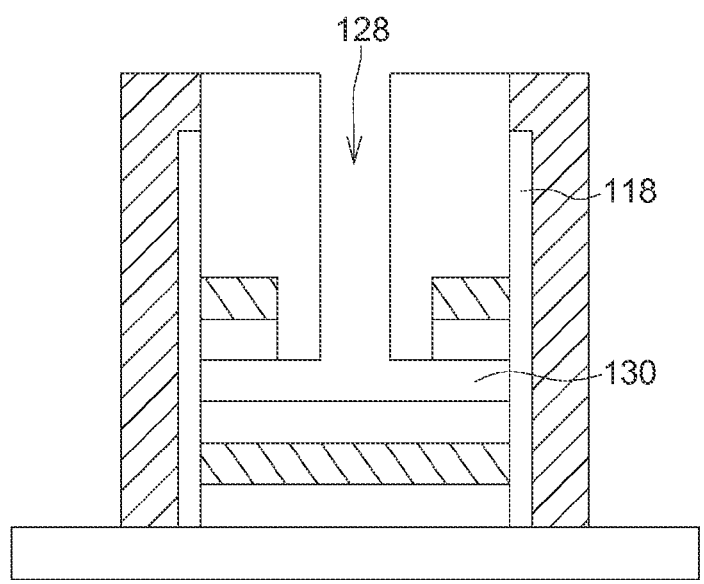
Figure 5C:
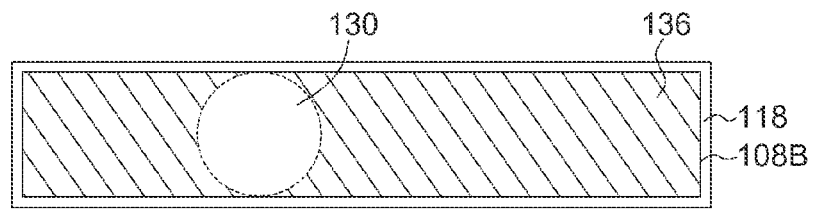

Referring to FIGS. 5A and 5B, and FIG. 5C which shows only the conductive film 108B and the dielectric layer 118, a portion of the conductive film 108B exposed by the through via 128 is removed until an etching condition reaches the dielectric layer 118. In one embodiment, the conductive film 108B is removed by an isotropic etching step having a high selectivity to the dielectric layer 118, i.e. mainly etching the conductive film 108B of un-doped Si or polysilicon. For example, the etching step comprises a wet etching of TMAH dip. In other embodiments, a chemical dry etching method may be used.

Figure 6A:
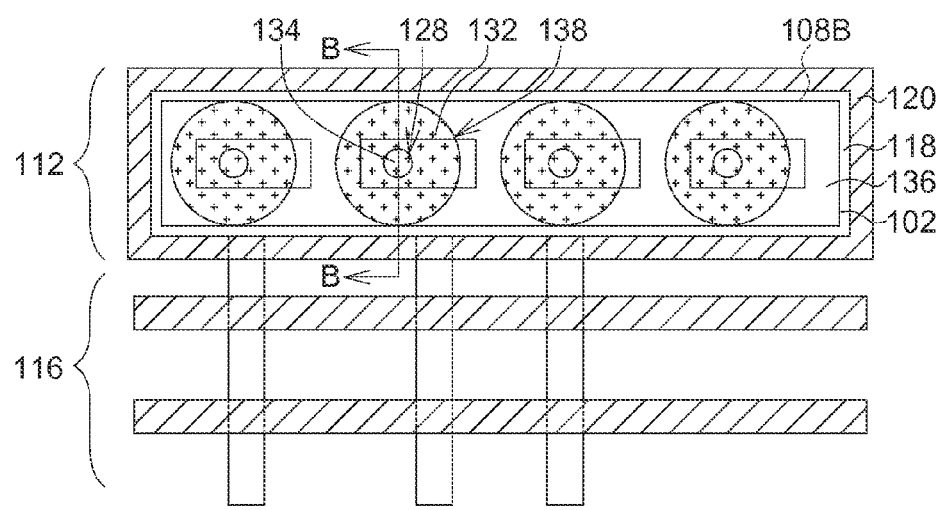
Figure 6B:
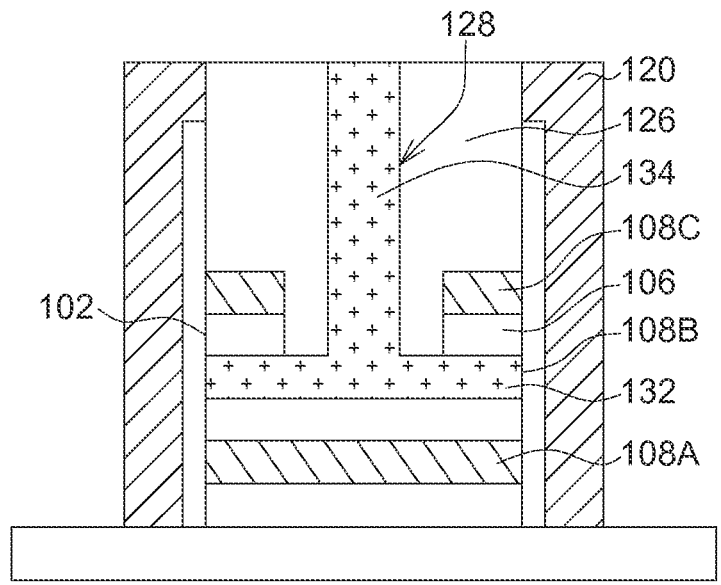
Figure 6C:
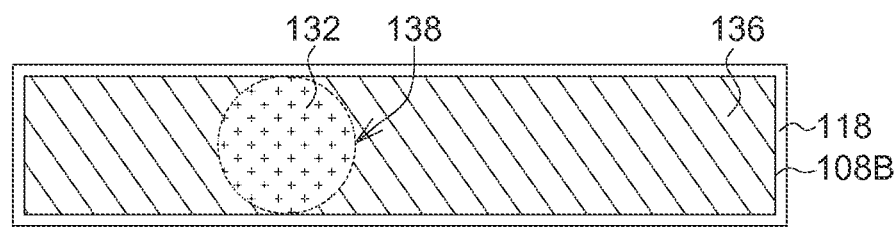

Referring to FIGS. 6A and 6B, and FIG. 6C which shows only the conductive film 108B and the dielectric layer 118, the removed portion 130 (FIGS. 5A~5C) of the conductive film 108B and the through via 128 are filled with a conductive material to a (one) portion 132 of the conductive film 108B and a conductive plug 134 passing through the dielectric structure 126 and physically contacting the one portion 132 the conductive film 108B. The conductive material may comprise a doped Si or a doped polysilicon, such as a heavily doped (N+) polysilicon, or a metal containing material such as TiN (barrier layer), W, Cu, metal silicides, etc. For example, the doped polysilicon may be formed by an in-situ deposition method. The conductive material may be formed by any suitable method. The one portion 132 of the conductive film 108B and the conductive plug 134 may have the same material or different materials. For example, the one portion 132 may have the doped polysilicon, and the conductive plug 134 may have a structure of TiN barrier layer and a W fill. A CMP process may be performed to form an upper planer surface.

The conductive plug 134 is separated or conductively insulated from the other conductive films, for example conductive films 108A, 108C, by the dielectric structure 126 and the dielectric film 106.

In embodiments, the conductive material for forming the one portion 132 of the conductive film 108B is different the conductive material for forming the other portion 136 of the conductive film 108B separated from the conductive plug 134. In other words, the conductive film 108B has a material interface 138 of the different conductive materials. The material interface 138 is adjoined with (or physically contacts) the dielectric layer 118 (not shown in FIGS. 1A, 2A, 3A, 4A, for the sake of brevity).

In one embodiment, an electric conductivity of the one portion 132 is higher than an electric conductivity of the other portion 136 of the conductive film 108B comprising the material illustrated in FIGS. 1A and 1B. For example, the conductive material for the one portion 132 comprises a doped polysilicon, such as a heavily doped (N+) polysilicon, or a metal containing material such as W, Cu, TiN, etc., and the conductive material for the other portion 136 comprises an un-doped polysilicon.

The conductive films 108A, 108B, 108C, 108D (FIG. 1B) of the strip portions 114 of the stacked structure 102 in the array region 116 are functioned as bit lines (BL). In embodiments, the bit lines are formed by an un-doped polysilicon, which usually has higher resistance than a doped polysilicon, such as a heavily doped (N+) polysilicon, or a metal containing material such as W, Cu, TiN, etc., and therefore a normal state of the bit lines of a three-dimensional (3D) stacked NAND flash memory is in an "off" state (normally OFF) and the bit lines can be easily controlled to turn "on" by applying a proper voltage to a string select line (SSL) (not shown) between the pad region 112 and the array region 116.

A proper voltage (such as 3.3V) may be applied to the conductive structure 120 functioned as an assistant gate to generate an inversion layer in a portion of the conductive films 108A, 108B, 108C, 108D (FIG. 1B) adjoined to the dielectric layer 118. Since the one portion 132 of the conductive film 108B functioned as a BL pad is also adjoined to the dielectric layer 118, the formed inversion layer overlaps (or physically connects) with the one portion 132 of the conductive film. The inversion layer and the one portion 132 of the conductive film 108B form a current path of low resistance so as to increase contact efficiency (or electrical conductivity) for a contact structure comprising the conductive film 108B and the conductive plug 134.

While the invention has been described by way of example and in terms of the exemplary embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate;
   a stacked structure comprising dielectric films and conductive films arranged alternately;
   a dielectric layer;
   a conductive structure, the dielectric layer being between the conductive structure and a sidewall of the stacked structure;
   a dielectric structure on the stacked structure and defining a through via; and
   at least one conductive plug, wherein the conductive plug fills the through via and physically contacting a first portion of one of the conductive films exposed by the through via and adjoined with the dielectric layer.

2. The semiconductor structure according to claim 1, wherein a material of the first portion of the one of the conductive films physically contacting the conductive plug is different from a material of a second portion of the one of the conductive films separated from the conductive plug.

3. The semiconductor structure according to claim 1, wherein an electric conductivity of the first portion of the one of the conductive films physically contacting the conductive plug is higher than an electric conductivity of a second portion of the one of the conductive films separated from the conductive plug.

4. The semiconductor structure according to claim 1, wherein a material of the first portion of the one of the conductive films physically contacting the conductive plug comprises a doped poly silicon or a metal containing material, a material of a second portion of the one of the conductive films separated from the conductive plug comprises an un-doped polysilicon.

5. The semiconductor structure according to claim 1, wherein the first portion of the one of the conductive films having a doped polysilicon material or a metal containing material physically contacts the dielectric layer.

6. The semiconductor structure according to claim 1, wherein the conductive plug is separated from the other of the conductive films by the dielectric structure and the dielectric layer.

7. The semiconductor structure according to claim 1, wherein an upper portion of the stacked structure above the one of the conductive films defines an opening filled with the dielectric structure.

8. The semiconductor structure according to claim 1, wherein the number of the at least one conductive plug is equal to or more than two, the conductive plugs respectively electrically connect the different conductive films.

9. The semiconductor structure according to claim 8, wherein the first portion of each of the conductive films physically contacts the corresponding one of the conductive plugs.

10. The semiconductor structure according to claim 1, wherein each of the dielectric films has a material interface of different materials.

11. The semiconductor structure according to claim 10, wherein the material interface physically contacts the dielectric layer.

12. The semiconductor structure according to claim 11, comprising an array region and a pad region, wherein the conductive plug is arranged in the pad region.

\* \* \* \* \*